(12) United States Patent
Yun et al.

(10) Patent No.: US 9,101,068 B2
(45) Date of Patent: Aug. 4, 2015

(54) TWO-STAGE POWER DELIVERY ARCHITECTURE

(71) Applicant: QUALCOMM Incorporated, San Diego, CA (US)

(72) Inventors: Changhan Yun, San Diego, CA (US); Francesco Carobolante, San Diego, CA (US); Chengjie Zuo, Santee, CA (US); Jonghae Kim, San Diego, CA (US); Mario Francisco Velez, San Diego, CA (US); Lawrence D. Smith, San Diego, CA (US); Matthew M. Nowak, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 138 days.

(21) Appl. No.: 13/830,033

(22) Filed: Mar. 14, 2013

(65) Prior Publication Data
US 2014/0268615 A1    Sep. 18, 2014

(51) Int. Cl.
*H05K 7/00*    (2006.01)
*H05K 7/10*    (2006.01)
*H05K 1/02*    (2006.01)
*H05K 1/16*    (2006.01)
*H01L 23/498*    (2006.01)

(52) U.S. Cl.
CPC ........ *H05K 7/1092* (2013.01); *H01L 23/49822* (2013.01); *H01L 23/49827* (2013.01); *H05K 1/0231* (2013.01); *H05K 1/165* (2013.01); *H01L 23/49816* (2013.01); *H05K 1/0243* (2013.01); *H05K 1/0262* (2013.01); *Y10T 29/4913* (2015.01); *Y10T 29/49128* (2015.01)

(58) Field of Classification Search
CPC .......... H05K 3/10; H05K 3/30; H05K 7/1092
USPC .......... 174/260, 255; 361/760, 761, 763, 781, 361/782, 783; 257/690–692
See application file for complete search history.

(56) References Cited

U.S. PATENT DOCUMENTS

| | | | |
|---|---|---|---|
| 6,392,899 B1 * | 5/2002 | Harrison et al. | 361/803 |
| 6,469,908 B2 | 10/2002 | Patel et al. | |
| 8,389,868 B2 * | 3/2013 | Leipold et al. | 174/260 |
| 8,498,129 B1 * | 7/2013 | Liu et al. | 361/764 |

(Continued)

OTHER PUBLICATIONS

Amelifard, et al., "Optimal Design of the Power Delivery Network for Multiple Voltage Island System on Chips", Computer Aided Design of Integrated Circuits and Systems, IEEE Transcation on vol. 28, Issue: 6, 2009, pp. 888-900.

(Continued)

*Primary Examiner* — Yuriy Semenenko
(74) *Attorney, Agent, or Firm* — Seyfarth Shaw LLP

(57) ABSTRACT

A two-stage power delivery network includes a voltage regulator and an interposer. The interposer includes a packaging substrate having an embedded inductor. The embedded inductor includes a set of traces and a set of through substrate vias at opposing ends of the traces. The interposer is coupled to the voltage regulator. The two-stage power delivery network also includes a semiconductor die supported by the packaging substrate. The two-stage power delivery network also includes a capacitor that is supported by the packaging substrate. The capacitor is operable to provide a decoupling capacitance associated with the semiconductor die and a capacitance to reduce a switching noise of the voltage regulator.

8 Claims, 7 Drawing Sheets

(56) References Cited

U.S. PATENT DOCUMENTS 8,659,909 B2* 2/2014 Searls et al. .................. 361/780
2010/0225436 A1* 9/2010 Papavasiliou et al. ........ 336/200
2011/0050334 A1* 3/2011 Pan et al. ...................... 327/564

OTHER PUBLICATIONS

COILCRAFT, "Square Air Core Inductors", Coilcraft Document 617, Rev. 14, Jun. 2011, 3 pgs.
Jain, et al., "Embedded Thin Film Capacitors—Theoretical Limits", IEEE Trans. Adv. Packag., vol. 25, 2002, pp. 454-458.
Mandhana, et al., "Comparative Study on Effectiveness of On-Chip, On-Package and PCB Decoupling for Core Noise Reduction by Using Broadband Power Delivery Network Models", Electronic Components and Technology Conference, Proceedings. 55th, 2005, pp. 732 739.
Onizuka, et al., "Stacked-Chip Implementation of On-Chip Buck Converter for Distributed Power Supply System in SiPs", IEEE Journal of Solid State Circuits. vol. 42, Issue: 11, 2007, pp. 2404-2410.
Wonyoung Kim, Meeta S. Gupta, Gu-Yeon Wei and David Brooks, "System Level Analysis of Fast, Per-Core DVFS using On-Chip Switching Regulators." IEEE International Symposium on High-Performance Computer Architecture (HPCA), Feb. 2008.

* cited by examiner

TWO-STAGE POWER DELIVERY ARCHITECTURE

TECHNICAL FIELD

The present disclosure generally relates to integrated circuits (ICs). More specifically, the present disclosure relates to two-stage power delivery architectures and related technologies to make and use them.

BACKGROUND

For integrated circuits used in wireless communication devices or other high-speed digital electronics, a power delivery network supplies power to the various components of the overall system. A power delivery network may include a voltage regulator module that regulates voltage for a component.

Dynamic voltage and frequency scaling are techniques for power savings. For example, a component may switch to a low power mode where lower voltage is used under certain circumstances. When the operating voltage changes, the component (e.g., a processor) may also operate at a lower frequency. When a voltage used by the component decreases, the voltage regulator module adjusts the power supplied to the component.

A conventional power delivery network utilizes a three-stage architecture. The voltage regulator feedback point and the point of load are far from each other in a three-stage architecture. The distance between the voltage regulator feedback point and the point of load causes a slower response in terms of dynamic voltage and frequency scaling. Slow dynamic voltage and frequency scaling leads to power inefficiency and a degradation in the overall performance of the power delivery network. Furthermore, the three-stage power delivery network architecture has more components and materials to fabricate, resulting in higher manufacturing costs.

SUMMARY

In one aspect, a two-stage power delivery network includes a voltage regulator and an interposer. The interposer includes a packaging substrate having an embedded inductor. The embedded inductor includes a set of traces and a set of through substrate vias at opposing ends of the traces. The interposer is coupled to the voltage regulator. The two-stage power delivery network also includes a semiconductor die supported by the packaging substrate. The two-stage power delivery network also includes a capacitor that is supported by the packaging substrate. The capacitor is operable to provide a decoupling capacitance associated with the semiconductor die and a capacitance to reduce a switching noise of the voltage regulator.

Another aspect discloses a two-stage power delivery network that includes a first stage and a second stage. The first stage includes a voltage regulator. The second stage includes an output device. The two-stage power delivery network also includes a single capacitance between the first stage and the second stage. The single capacitance includes a capacitance to reduce a switching noise from the voltage regulator and a decoupling capacitance associated with the output device.

In another aspect, a method of fabricating a two-stage power delivery network is disclosed. The method includes fabricating a set of through substrate vias in a packaging substrate. The method also includes depositing a first set of traces on a first surface of the packaging substrate. The method also includes coupling the first traces to the through substrate vias. The method also includes depositing a second set of traces on a second surface of the packaging substrate. The method also includes coupling the second traces in a serpentine manner to the first traces on the first surface of the packaging substrate to form a 3D inductor. The method further includes fabricating a capacitor on the packaging substrate.

Another aspect discloses a two-stage power delivery network that includes a voltage regulator and an interposer. The interposer includes a packaging substrate having an embedded inductor including a set of traces and a set of through substrate vias at opposing ends of the traces. The interposer is coupled to the voltage regulator. The two-stage power delivery network also includes a die supported by the packaging substrate. The two-stage power delivery network also includes a means for storing charge supported by the packaging substrate. The means for storing charge includes means for decoupling stored charge associated with the die and means for reducing a switching noise of the voltage regulator.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
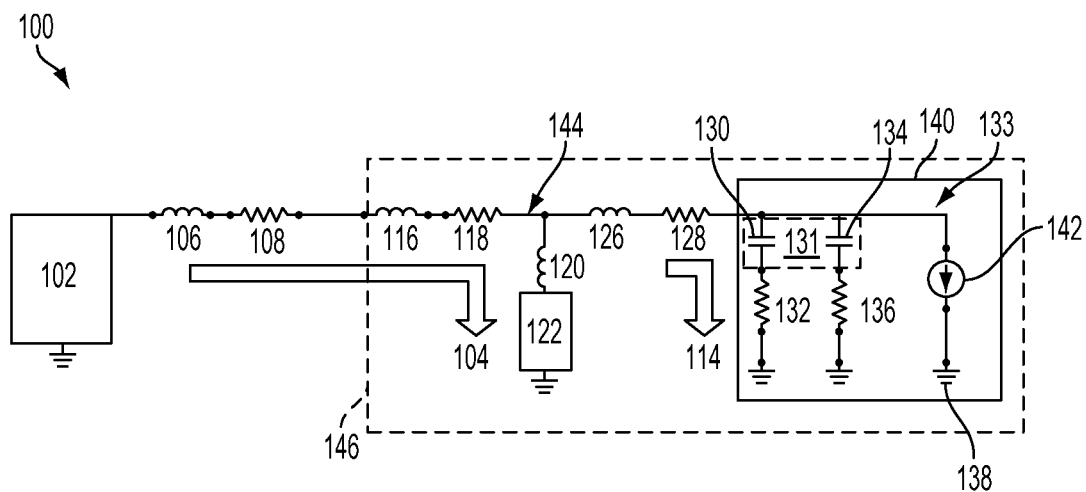
FIG. 1 is a schematic diagram of a two-stage power delivery network according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

A conventional three-stage power delivery network usually includes (1) low-pass filtering on-board capacitance, (2) an on-package decoupling capacitance ("decap"), and (3) an on-die capacitance in the semiconductor die. One of the parameters that affects impedance and performance of the three-stage power delivery network is the second stage decoupling capacitor placement relative to the "trace" inductance and the decoupling capacitor's parasitic inductance (e.g., equivalent series inductance). That is, the lower the impedance (which is adjusted by changing the capacitance and inductance values of the power delivery network), the better the performance.

There are a number of techniques that can be used to adjust the capacitance and inductance of any power delivery network. For example, high density metal-insulator metal thin-film capacitors or low-equivalent series inductance wide band capacitors may be used. Such capacitors have flexible capacitances and result in improved impedance and performance when compared to typical multi-layer co-fired ceramic capacitors. Also, the trace inductance may be adjusted by using through-glass interposer or passive on glass technologies that also integrate decoupling capacitors with the substrate having the inductor.

In the implementation of the three-stage power delivery network, there are currently at least three stages of capacitances that are specified between a power management integrated circuit and an output device. The first stage may be used to reduce or eliminate low frequency noise (e.g., around 1 MHz) from a switch-mode power supply and the printed circuit board. The second stage may be used to reduce or eliminate mid-frequency noise (e.g., around 10 MHz) from the package of the overall device. That is, there are two separate capacitances in the first and the second stages: the first capacitance in the first stage to reduce the switching noise for the voltage regulator module, and the second capacitance that is mainly the decoupling capacitance for the output device. The third stage may be used to prevent the first drop in frequency response (in a time domain transient analysis, for example) when the output device is in a transient mode. The overall switching noise of the three-stage power delivery network is in the range of 1-40 MHz. A package decoupling capacitance may reduce the board and package switching noise by an order of 100 MHz.

Because many contemporary devices demand high current, the switching capabilities of the point of load in performing a DC to DC voltage conversion can be fast. This fast performance is specified by dynamic voltage and frequency scaling. Furthermore, in this three-stage implementation, there is a large discrepancy between the frequency responses of the voltage regulator feedback point and the point of load. The voltage regulator feedback point and the point of load are far from each other. The distance between the voltage regulator feedback point and the point of load causes a slower response in terms of dynamic voltage and frequency scaling. Furthermore, a performance improvement in each stage will yield only a minor performance enhancement.

According to an aspect of the present disclosure, a novel two-stage power delivery network architecture results in improved impedance and performance, and is a suitable alternative to the conventional three-stage power delivery network. The two-stage power delivery network merges the low pass filter and on-package decoupling capacitor stages into one stage. The power delivery network is simplified into just two stages: (1) the low pass filter stage and (2) the on-die capacitance stage, resulting in improved transient response and increased performance. Furthermore, the capacitance and inductance may be improved in the two-stage power delivery network by state of the art technologies. For the capacitance, high density metal-insulator-metal thin-film capacitors or low-equivalent series inductance wide band capacitors may be used. For the inductance, high-density solenoid inductors using through glass vias and through glass interposer technology may be used to achieve high-power and low-loss with improved impedance and performance.

A two-stage power-delivery network implementation solves problems of the three-stage power-delivery network implementation. In one configuration, the effect of the package decoupling capacitance is reduced and the architecture improves the overall impedance and the transient analysis. For example, high performance embedded passive substrate decoupling capacitances may be used to provide a low equivalent series inductance and a low wide band impedance profile. Also, through glass interposer inductors that are high-power and low-loss may be used to reduce trace inductance. High performance decoupling capacitors may also be used. In addition, the decoupling capacitors and/or low pass filter capacitors may be directly integrated with the through glass interposer inductor on one side of the substrate in which the inductor is embedded, for example.

FIG. 1 is a schematic diagram of a two-stage power delivery network 100 according to an aspect of the present disclosure. A two-stage power delivery network 100 includes a voltage regulator module 102, a first stage 104 and a second stage 114. There is also a voltage regulator feedback point 144 between the first stage 104 and the second stage 114. The first stage 104 includes parasitic inductance 116, 120, parasitic resistance 108, 118, and a first capacitance 122. The second stage 114 includes parasitic inductance 126, parasitic resistance 128, and a point of load 140. The point of load 140 has an on-die capacitance 131 that may include an internal capacitance 130 and a damping capacitance 134. The point of load 140 also includes an internal resistance 132, an overall impedance 133, a damping resistance 136 and an output device 142. The overall impedance 133 is an impedance taken of the two-stage power delivery network 100 which may be measured from the point above the output device 142. There is also a ground terminal 138 within the two-stage power delivery network 100. The first stage 104 and the second stage 114 are within a package 146, which may include a package substrate 148, as more clearly shown in FIG. 2.

The voltage regulator module 102 is a device configured to maintain a constant voltage level. The inductance 106 may include combined inductance of the voltage regulator module 102 (or a surface mount technology inductance, or inductance caused by surface mount technology) in addition to parasitic inductance from the printed circuit board 154 (shown in FIG. 2). The first capacitance 122 may include the combined capacitance from the voltage regulator module 102 and any decoupling capacitance from any nearby components. The inductance 120 may include any trace inductance from the overall device near the second stage 114.

As shown in FIG. 1, the on-die capacitance 131 may include any capacitance or decoupling capacitance distributed over the two-stage power delivery network 100, including the internal capacitance 130 and the damping capacitance 134. The internal capacitance 130 may include any capacitance internal to the point of load 140. The internal resistance 132 may include any resistance internal to the point of load 140. The damping capacitance 134 may include any capacitance that dampens or suppresses the capacitance of the point of load 140. The damping resistance 136 may include any resistance that dampens or suppresses the resistance of the point of load 140.

The output device 142 may be any device that would receive power, or that would benefit from a power delivery network, such as the two-stage power delivery network 100. For example, in one implementation, the output device 142 may be a modem, an application processor or any such similar device. In one implementation, the output device 142 is implemented as a die.

The first capacitance 122 combines both the capacitance that reduces the switching noise from the voltage regulator module 102 and the decoupling capacitance for the output device 142 into one single capacitance. Therefore, the stages are reduced and the first capacitance 122 more efficiently handles capacitances for both stages of the two-stage power delivery network 100.

The two-stage implementation and design shown in FIG. 1 eliminates the first, low-frequency stage from the three-stage power delivery network implementation, and moves the regulation point or the voltage regulator feedback point closer to the point of load 140. A configuration that moves the voltage regulator feedback point 144 and point of load 140 closer together provides faster dynamic voltage and frequency scaling. Fast load interaction between a power management IC and the output device 142 is also promoted. Moving the voltage regulator feedback point 144 closer to the point of load 140 also results in just one pole and one resonance in the frequency response, as opposed to multiple poles of the three-stage power delivery network implementation. This improves performance. In one implementation, the loop to generate the one pole or one resonance includes the on-die decoupling capacitance (such as first capacitance 122), the fourth inductance 126, and the total inductance of the two-stage power delivery network 100. Having one pole or one resonance in the frequency response also means there is no ringing, or unnecessary drooping patterns in the frequency response. Another benefit of the two-stage implementation is a fast transient response.

Figure 2:
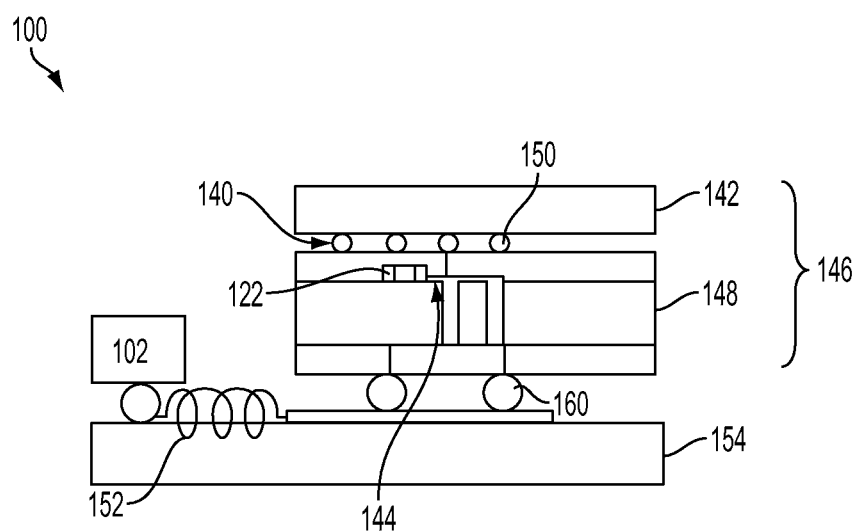
FIG. 2 is a diagram of a two-stage power delivery network according to an aspect of the present disclosure.

FIG. 2 is a layout diagram of the two-stage power delivery network 100 according to an aspect of the present disclosure. The two-stage power delivery network 100 includes the voltage regulator module 102, the first capacitance 122, the output device 142, the voltage regulator feedback point 144, and the point of load 140. The network 100 also has a package substrate 148, first conductive interconnects 150, second conductive interconnects 160, a printed circuit board 154, and surface mount technology inductance 152. A package 146 includes the output device 142, the point of load 140, the first conductive interconnects 150, the first capacitance 122, and the package substrate 148. The voltage regulator module 102, the first capacitance 122, the output device 142, the voltage regulator feedback point 144, the package 146, and the point of load 140 are the same components as seen in FIG. 1. However, the first capacitance 122 can be more clearly seen as the capacitance on the package substrate 148, which may also include the capacitance from the voltage regulator module 102 and decoupling capacitance from any other nearby components.

Furthermore, the first capacitance 122 may also be the only capacitance in the two-stage power delivery network 100. In other words, there are no longer other capacitances, such as surface mount technology capacitances, voltage regulator module capacitances or bulk capacitances. The output device 142 may be deposited over the package substrate 148, as shown in FIG. 2. The voltage regulator feedback point 144 may be contained within the first capacitance 122, unlike the voltage regulator feedback point in the three stage power delivery network, which is coupled to multiple components. The point of load 140 may also be contained with the conductive interconnects coupling the output device 142 with the package substrate 148. In one implementation, the conductive interconnect may be, for example, solder balls, solder pillars, or solder bumps. The surface mount technology inductance 152 may also include the inductance from the voltage regulator module 102, which is in turn included in the inductance 106 along with any inductance from the printed circuit board 154. The package 146 may also include the output device 142, the point of load 140, the first conductive interconnects 150, the first capacitance 122, and the package substrate 148.

In one implementation, thick conductive films (e.g., metal) may be used on both sides of the capacitors (such as capacitors 122, 131, 130 and 134) to give the capacitors a high Q (or quality) factor. The bottom plate may have a conductive film of up to 5 μm and the top plate may have conductive film of up to 3 μm. This may be uncommon in traditional CMOS based capacitors, which often use thin metals (100 to 200 nm). Traditional capacitor fabrication processes also use a thinner bottom plate and a thicker bottom plate due to the planarity of stack up layers. The thinner bottom layer also allows improved process control over subsequently deposited layers. In one implementation, the capacitors may also be implemented as a layered structure such as a layered metal-insulator-metal structure. In one implementation, the capacitor may also be a through substrate interposer capacitor that is fabricated through a substrate (such as the package substrate 148), or a through glass interposer capacitor, if the substrate is glass.

In one implementation, high density metal-insulator-metal thin-film capacitors or low-equivalent series inductance wide band capacitors may be used. In one implementation, materials that may be used to fabricate the capacitors include aluminum oxide ($Al_2O_3$), zinc oxide ($ZrO_2$) and titanium oxide ($TiO_2$). Other techniques may be used to enhance the area of the capacitors, such as double layer metal-insulator-metal capacitor structure to double the area enhancement, a shallow trench capacitor structure for nearly triple the area, a deep trench through substrate capacitor structure for more than ten times area gain, or any combination of the above techniques or above listed materials. For further improvement of capacitor density or area, other trench or through substrate capacitor structures may be used.

In one implementation, the trace inductance may be reduced by placing the decoupling capacitance side-by-side or adjacent to the application processor or output device. In one implementation, the trace inductance may be reduced by embedding the decoupling capacitance underneath the application processor or output device, or within the substrate. In one implementation, the trace inductance may be reduced by placing the decoupling capacitance at a surface of the substrate or interposer with multiple links to the power supply or Vdd, or right on the Vdd conductive interconnects on the application processor or output device.

In one implementation, the package substrate 148 may include a substrate located in the middle and two interposer layers surrounding it, as shown in FIG. 2. In one implementation, the package substrate 148 may be an interposer. In another implementation, the package substrate 148 may be a substrate with no interposer materials. An interposer may be defined to be an electrical interface routing between one link to another.

Figure 3:
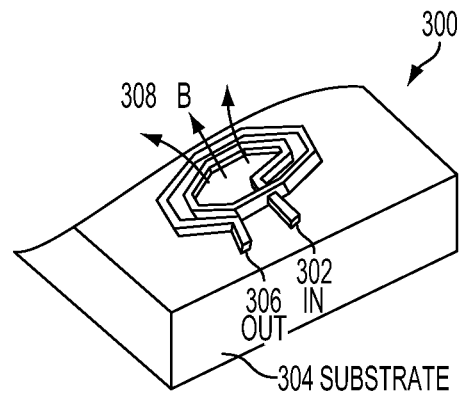
FIGS. 3 and 4 are perspective views of inductors that may be used in a two-stage power delivery network implementation according to aspects of the present disclosure.
Figure 4:
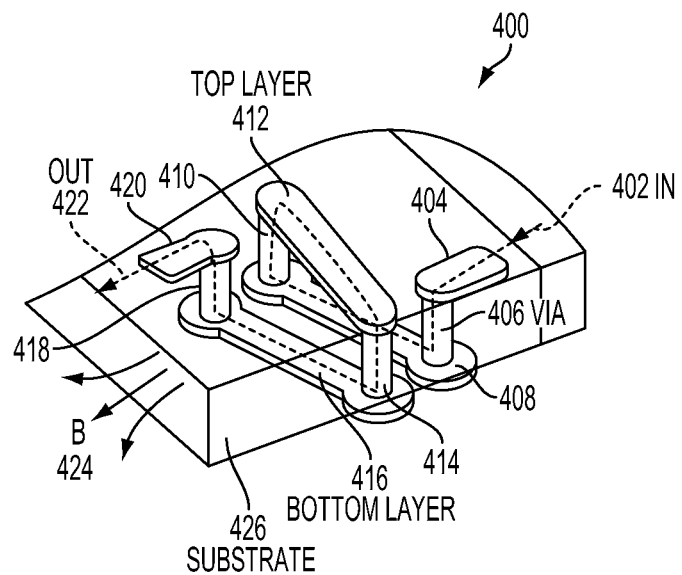

FIGS. 3 and 4 are top-down views of inductors that may be used in a two-stage power delivery network implementation according to aspects of the present disclosure. FIG. 3 shows one possible implementation of a planar inductor 300 that is on top of a substrate 304 and does not extend through the substrate. An input 302 and an output 306 of the planar inductor 300 generate a planar magnetic field 308 relative to the plane of the substrate 304. The planar inductor 300, however, does not use the entire substrate 304, and may be limited in terms of electromagnetic inductance as well as being subject to switching noise.

FIG. 4 shows a through substrate inductor 400 that is integrated within a substrate 426 and extends through it. Current runs through an input 402, a first top conductive layer 404, a first via 406, and a first bottom conductive layer 408. The current then flows through a second via 410, a second top conductive layer 412, a third via 414, a second bottom conductive layer 416, a fourth via 418, a third top conductive layer 420 and finally an output 422. The current flow generates a lateral magnetic field 424. The lateral magnetic field 424 has improved electromagnetic inductance when compared to a planar magnetic field 308, which moves in the planar direction. Because the lateral magnetic field 424 is in the lateral direction, it possesses switching noise shielding and prevents switching noise more so than the planar magnetic field 308.

Figure 5B:
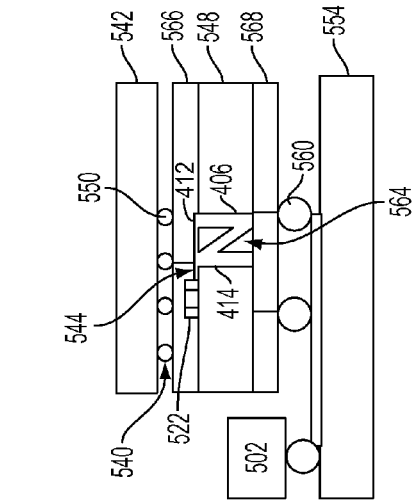
FIG. 5B is a diagram of a two-stage power delivery network implementation according to an aspect of the present disclosure.
Figure 5D:
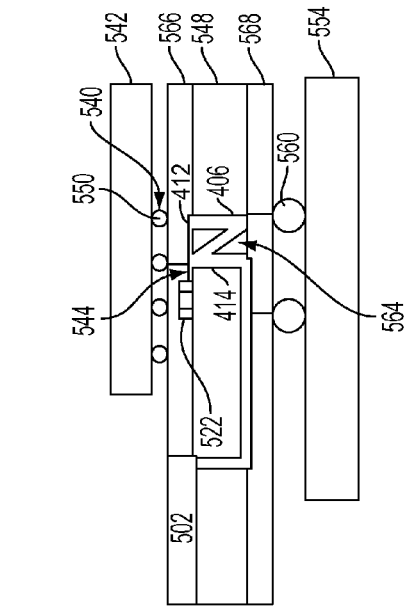
FIG. 5D is a diagram of a two-stage power delivery network implementation according to an aspect of the present disclosure.
Figure 5A:
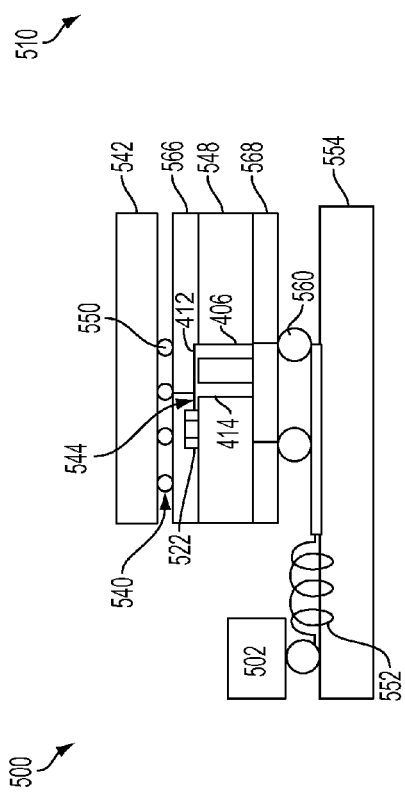
FIG. 5A is a diagram of a two-stage power delivery network implementation according to an aspect of the present disclosure.

FIG. 5A is a diagram of a two-stage power delivery network 500 according to an aspect of the present disclosure. The implementation of the two-stage power delivery network 500 is similar to the two-stage power delivery network 100 shown in FIG. 2. The two-stage power delivery network 500 includes a voltage regulator module 502, a point of load 540, an output device 542, a voltage regulator feedback point 544, a package substrate 548, a set of first conductive interconnects 550, a capacitance 522, a set of second conductive interconnects 560, a printed circuit board 554 and an inductance 552. The capacitance 522 may be package capacitance generated from being on the package substrate 548, and the inductance 552 may be inductance caused by surface mount technology when the voltage regulator module 502 is adhered to the printed circuit board 554, for example, as well as any distributed inductance, or any trace inductance caused by the printed circuit board 554. A goal is to reduce both the inductance 552 and the capacitance 522 as much as possible to improve speed, performance and to achieve a fast transient response.

FIG. 5B is a diagram of a two-stage power delivery network 510 according to another aspect of the present disclosure. The two-stage power delivery network 510 is similar to the two-stage power delivery network 500 from FIG. 5A. The difference is that the inductor 564 is implemented in the package substrate 548 as a through substrate interposer inductor or through glass interposer inductor, if the package substrate 548 is glass. By implementing the inductor 564 as a through substrate interposer or a through glass interposer inductor, the inductance 552 from FIG. 5A is significantly reduced, although there still may be some inductance that exists by virtue of the voltage regulator module 502 being coupled to the printed circuit board 554 with the set of second conductive interconnects 560. Also, as a result of the inductor 564 being implemented as a through substrate interposer or through glass interposer inductor, the capacitance 522 is reduced and mainly results from the inductor 564. In one implementation, the capacitance 522 may be a through substrate interposer capacitor that is fabricated in the package substrate 548, or a through glass interposer capacitor, if the package substrate 548 is glass. In one implementation, the inductor 564 may be the main inductor at the output of the voltage regulator module 502.

Figure 5C:
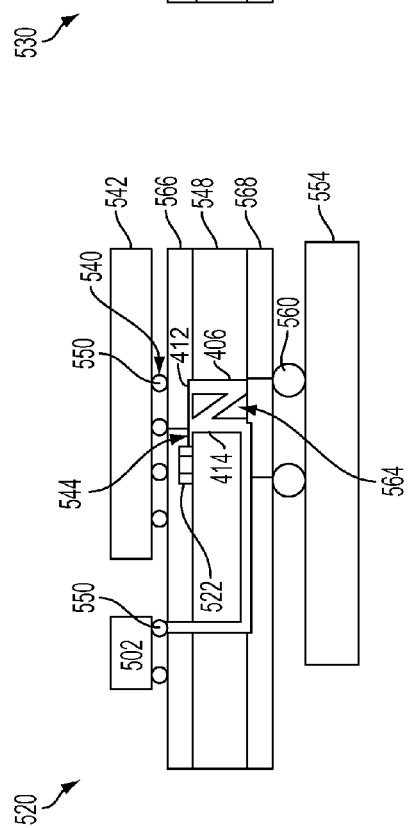
FIG. 5C is a diagram of a two-stage power delivery network implementation according to an aspect of the present disclosure.

FIG. 5C is a diagram of a two-stage power delivery network 520 according to yet another aspect of the present disclosure. The two-stage power delivery network 520 is similar to the two-stage power delivery network 510 from FIG. 5B. The difference is that the voltage regulator module 502 is now provided on the package substrate 548 (which may be glass) coupled with the set of first conductive interconnects 550 located at the point of load 540. By integrating the voltage regulator module 502 onto the package substrate 548 with the set of first conductive interconnects 550, the previous inductance 552 from FIG. 5A or any inductance caused from voltage regulator module 502 contacting the printed circuit board 554 via the second conductive interconnects 560 from FIG. 5B is significantly reduced or may even be eliminated.

Although there may be some inductance from the voltage regulator module 502 contacting the package substrate 548 with the set of smaller first conductive interconnects 550 at the point of load 540, the inductance may be less compared to the inductance incurred when the voltage regulator module 502 contacts the printed circuit board 554 via the set of second conductive interconnects 560. In one implementation, the conductive interconnects (e.g., the set of second conductive interconnects 560 and the set of first conductive interconnects 550 at point of load 540) are for example, solder balls, solder pillars, or solder bumps. The overall inductance is also reduced by having an inductor 564 that is implemented as a through substrate interposer or a through glass interposer inductor, as discussed above in FIG. 5B. The through substrate interposer or through glass interposer approach shown in FIGS. 5B and 5C also reduces the capacitance 522.

FIG. 5D is a diagram of a two-stage power delivery network 530 according to an aspect of the present disclosure. The two-stage power delivery network 530 is similar to the two-stage power delivery network 520 from FIG. 5C, the difference being that the voltage regulator module 502 is integrated into a surface of the package substrate 548. By integrating the voltage regulator module 502 with a surface of the package substrate 548, any inductance from the voltage regulator module 502 is significantly reduced if not altogether eliminated. The overall inductance is also reduced by having an inductor 564 that is implemented as a through substrate interposer or a through glass interposer inductor, as discussed above in FIGS. 5B and 5C.

Figure 5E:
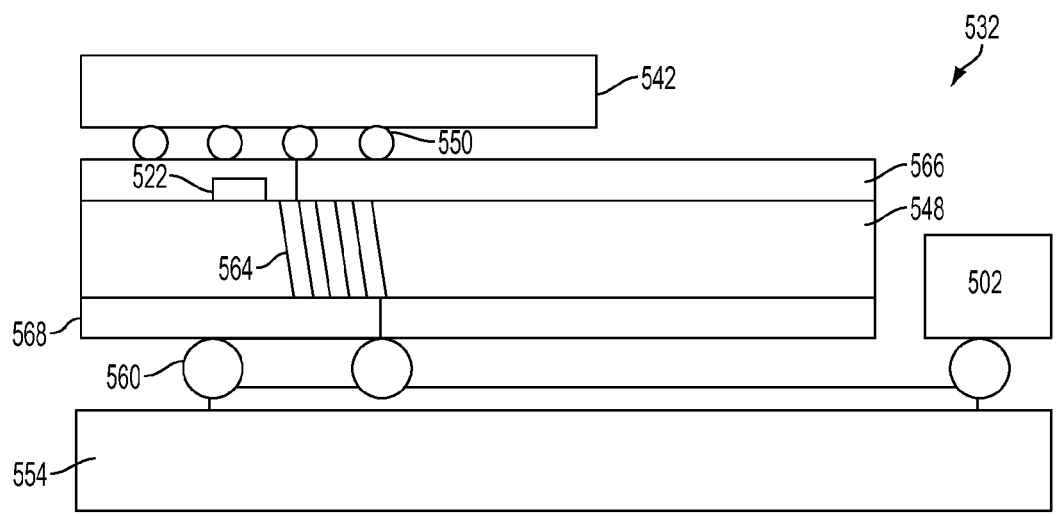
FIG. 5E is a close-up diagram of a two-stage power delivery network implementation according to an aspect of the present disclosure.

FIG. 5E is a diagram of a two-stage power delivery network 532 according to still another aspect of the present disclosure. The two-stage power delivery network 532 is similar to the two-stage power delivery network 510 from FIG. 5B, but slightly enlarged. The two-stage power delivery network 532 includes a voltage regulator module 502, first conductive interconnects 550 (which may be at the same location as the point of load 540 shown in FIGS. 5A-5D), an output device 542, a package substrate 548, a first interposer surface 566, a second interposer surface 568, an inductance 564, a capacitance 522, second conductive interconnects 560 and a printed circuit board 554.

The first interposer surface 566 and the second interposer surface 568 may include layers or protective materials to protect the package substrate 548 located in between. In one implementation, the package substrate 548 may be constructed from a low loss material that includes glass, air, quartz, sapphire, high-resistivity silicon, or other like semiconductor materials. A through substrate interposer inductor 564 may then be inserted through the package substrate 548. If the material of the package substrate 548 is glass, then the inductor 564 will be known as a through glass interposer inductor 564.

In one implementation, the capacitance 522 may be implemented as a through substrate interposer capacitor or a through glass interposer capacitor, if the package substrate 548 is glass. Although there may be some inductance as a result of the voltage regulator module 502 contacting the printed circuit board 554 with the second conductive interconnects 560, there is less inductance overall. There is less overall inductance because of the use of a through glass interposer inductor as the inductor 564 as part of the overall design of the two-stage power delivery network 532.

In one implementation, the package substrate 548 and the interposer surfaces 566 and 568 may be characterized as an overall substrate or interposer. In the case of FIG. 5E, that would mean both surfaces/layers 566 and 568 would also be made of the low loss material including glass, air, quartz, sapphire, high-resistivity silicon or other like semiconductor materials, although they could be made of dielectric or insulating materials. In one implementation, the package substrate 548 includes a substrate located in the middle and two layers surrounding it, as shown in FIGS. 5A, 5B, 5C, 5D and 5E. For example, in FIG. 5E, the package substrate 548 is in the middle of the two interposer surfaces 566 and 568, which may be protective layers. In one implementation, the package substrate 548 may be an interposer. In another implementation, the package substrate 548 is a substrate, with no interposer materials.

In one implementation, the trace inductance is reduced by placing the decoupling capacitance side-by-side or adjacent to the application processor or output device. In another implementation, the trace inductance may be reduced by embedding the decoupling capacitance underneath the application processor or output device, or within the substrate. In yet another implementation, the trace inductance may be reduced by placing the decoupling capacitance at a surface of the substrate or interposer with multiple links to the power supply or Vdd, or right on the Vdd conduction interconnects on the application processor or output device.

Figure 6:
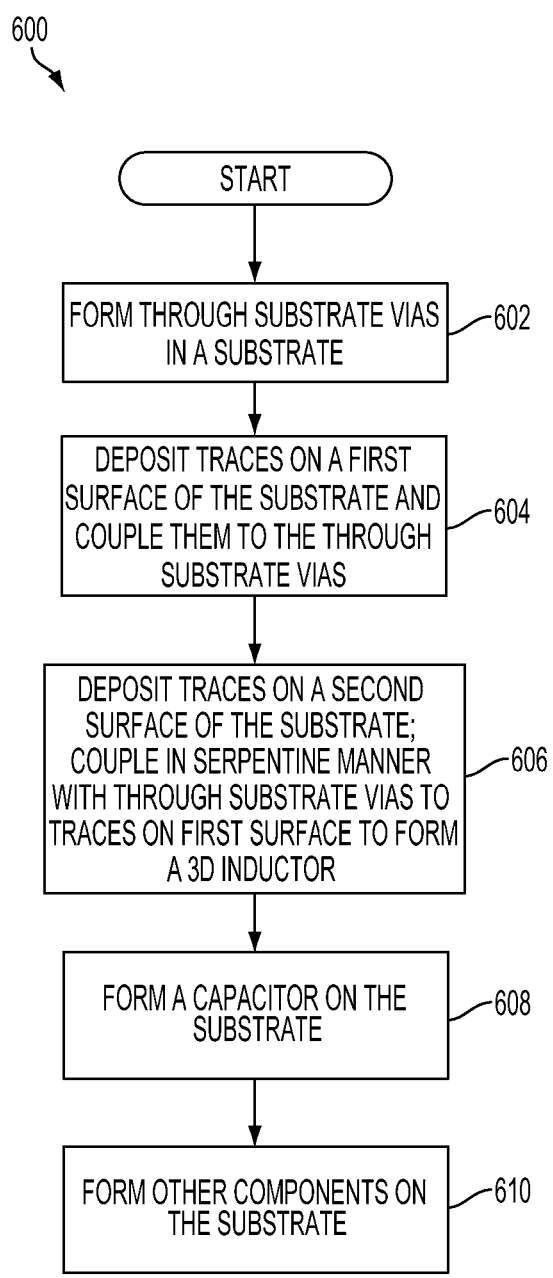
FIG. 6 is a process flow diagram illustrating a method of making a two-stage power delivery network according to an aspect of the present disclosure.

FIG. 6 is a process flow diagram 600 illustrating a method of making a two-stage power delivery network according to an aspect of the present disclosure. In block 602, through substrate vias are formed in a substrate. In block 604, traces are deposited on a first surface of the substrate and they are then coupled to the through substrate vias. In block 606, traces are deposited on a second surface of the substrate. The traces on the second surface of the substrate are then coupled in a serpentine manner with the through substrate vias to the traces on the first surface of the substrate in order to form a 3D inductor or a through substrate inductor.

In block 608, a capacitor may then be formed on the substrate. In one implementation, a capacitor may be formed on the substrate before block 602, or after block 610. In block 610, other components may be formed on the substrate. This may include, for example, integrating a voltage regulator module onto a surface of the substrate, adhering an output device to a surface of the substrate, adhering the substrate to a printed circuit board, adhering a voltage regulator module to a printed circuit board, and coupling the voltage regulator module to the substrate. In one implementation, the integrating, adhering and coupling may be done by semiconductor fabrication processes such as etching, development, deposition or sputtering, or by connection with solder balls, solder pillars or solder bumps.

According to a further aspect of the present disclosure, circuitry for a two-stage power delivery network is described. The two-stage power delivery network includes a voltage regulator and an interposer that is coupled to the voltage regulator. The interposer may be a packaging substrate having an embedded inductor including multiple traces and through substrate vias at opposing ends of the traces. The two-stage power delivery network also includes a die supported by the packaging substrate. The two-stage power delivery network further includes a means for storing charge. The storage means may include means for decoupling stored charge associated with the die and means for reducing switching noise of the voltage regulator. The charge storing means may be the package capacitor 122 or 522. In another aspect, the aforementioned means may be any module or any apparatus configured to perform the functions recited by the aforementioned means.

Figure 7:
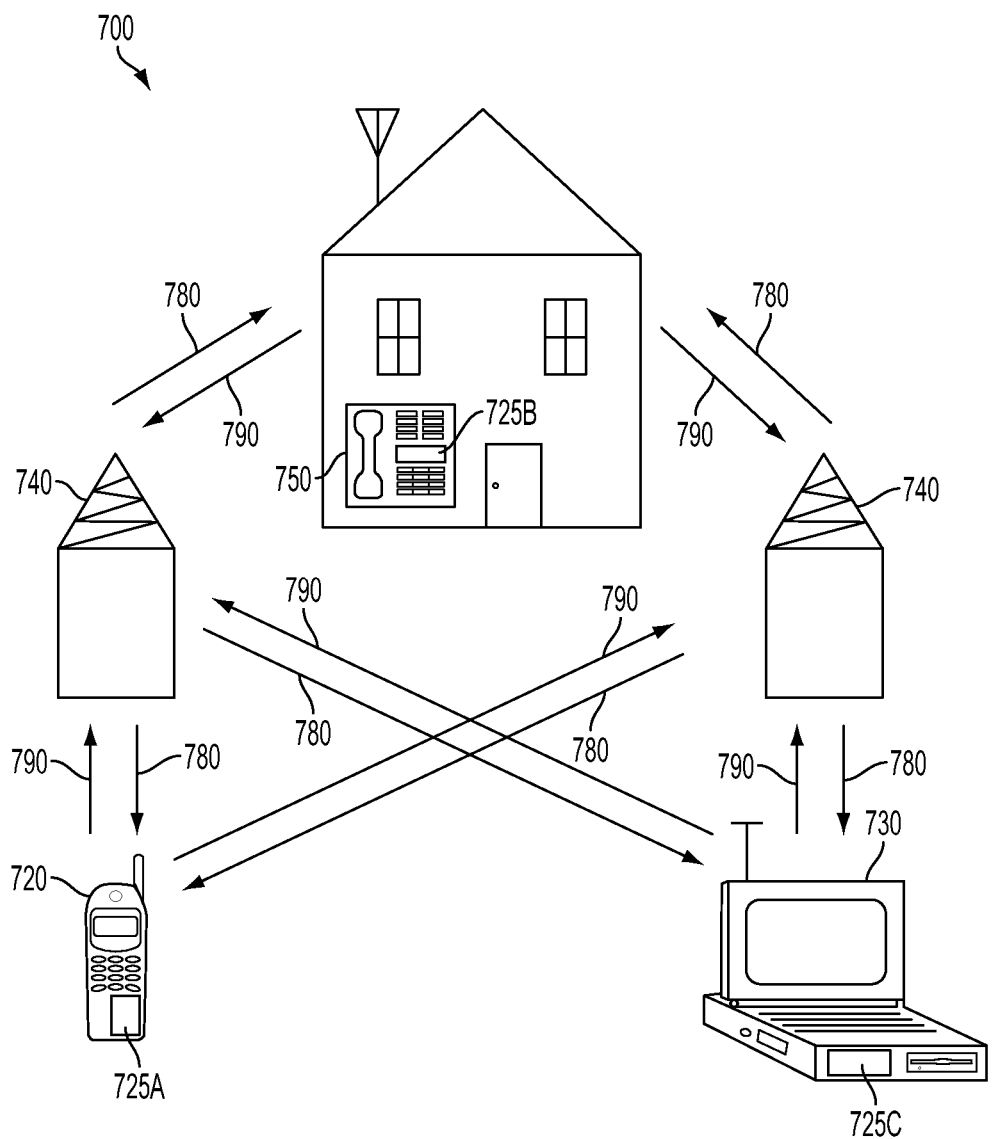
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that may include the disclosed power delivery network devices. It will be recognized that other devices may also include the disclosed power delivery network devices, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed power delivery network devices.

Figure 8:
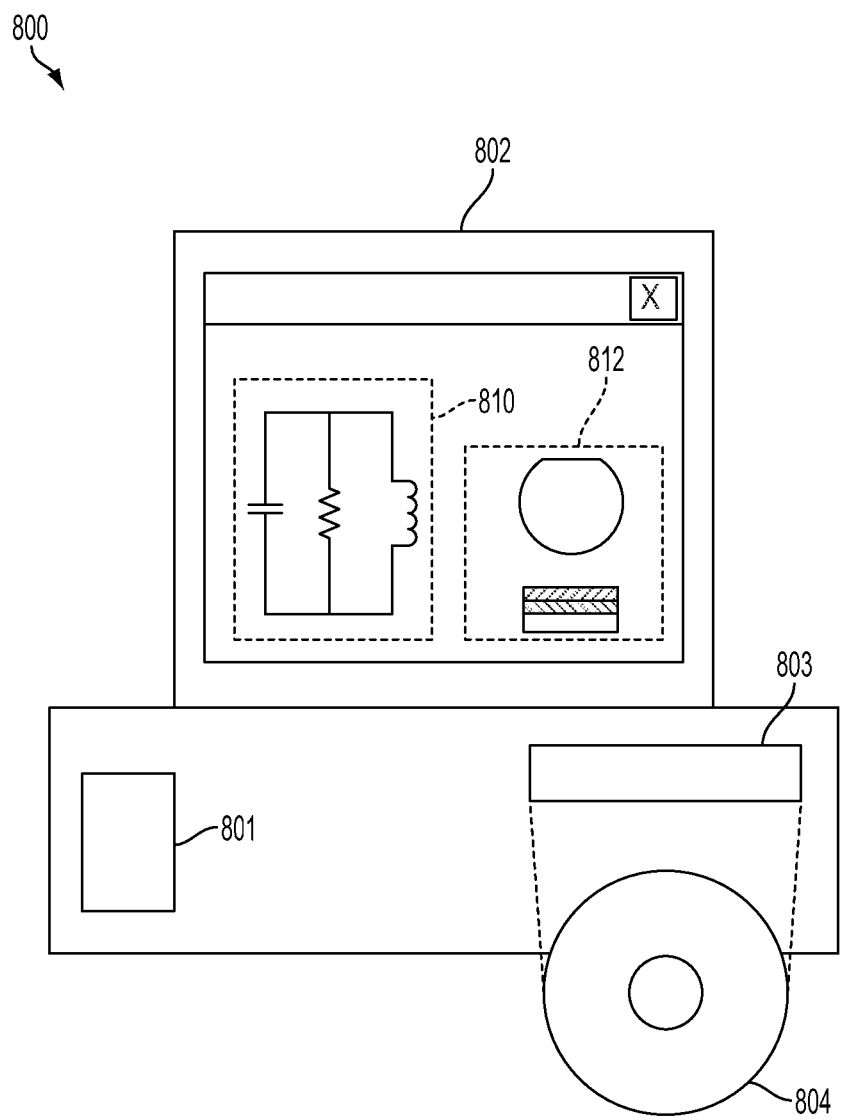
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the disclosed power delivery network devices. A design workstation 800 includes a hard disk 801 containing operating system software, support files, and design software such as Cadence or OrCAD. The design workstation 800 also includes a display 802, to facilitate design of a circuit 810 or a semiconductor component 812 such as a power delivery network device. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A two-stage power delivery network, comprising:
a voltage regulator;
an interposer comprising a packaging substrate having an embedded inductor including a plurality of traces and a plurality of through substrate vias at opposing ends of the plurality of traces, the interposer coupled to the voltage regulator;
a semiconductor die supported by the packaging substrate; and
a metal-insulator-metal capacitor directly on the packaging substrate and embedded within a protective layer of the interposer, the metal-insulator-metal capacitor operable to provide a decoupling capacitance associated with the semiconductor die and a capacitance to reduce a switching noise of the voltage regulator.

2. The two-stage power delivery network of claim 1, further comprising a printed circuit board supporting the packaging substrate and the voltage regulator.

3. The two-stage power delivery network of claim 1, in which the packaging substrate comprises glass, air, quartz, sapphire or high-resistivity silicon.

4. The two-stage power delivery network of claim 1, in which opposing sides of the capacitor comprise thick conductive films to provide a high quality factor value.

5. The two-stage power delivery network of claim 1, in which the voltage regulator is provided on a surface of the interposer.

6. The two-stage power delivery network of claim 1, integrated into a mobile phone, a set top box, a music player, a video player, an entertainment unit, a navigation device, a computer, a hand-held personal communication systems (PCS) unit, a portable data unit, and/or a fixed location data unit.

7. A two-stage power delivery network, comprising:
a means for regulating voltage;
an interposer comprising a packaging substrate having an embedded inductor including a plurality of traces and a plurality of through substrate vias at opposing ends of the plurality of traces, the interposer coupled to the voltage regulating means;
a die supported by the packaging substrate; and
a metal-insulator-metal capacitor directly on the packaging substrate and embedded within a protective layer of the interposer, the metal-insulator-metal capacitor operable to provide a decoupling capacitance associated with the semiconductor die and a capacitance to reduce a switching noise of the voltage regulating means.

8. The two-stage power delivery network of claim 7, integrated into a mobile phone, a set top box, a music player, a video player, an entertainment unit, a navigation device, a computer, a hand-held personal communication systems (PCS) unit, a portable data unit, and/or a fixed location data unit.

\* \* \* \* \*